United States Patent
Hageman et al.

(10) Patent No.: US 6,937,101 B2
(45) Date of Patent: Aug. 30, 2005

(54) DUAL MODE POWER AMPLIFIER HAVING A COMMON CONTROLLER

(75) Inventors: Michael L. Hageman, Ely, IA (US); Paul R. Andrys, Swisher, IA (US); Michael L. Gerard, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/137,718

(22) Filed: Apr. 30, 2002

(65) Prior Publication Data

US 2003/0201829 A1 Oct. 30, 2003

(51) Int. Cl.⁷ .............................................. H03G 3/30
(52) U.S. Cl. ...................... 330/285; 330/127; 330/296
(58) Field of Search ................................ 330/127, 129, 330/279, 285, 296, 307

(56) References Cited

U.S. PATENT DOCUMENTS 5,060,294 A  *  10/1991  Schwent et al. ............. 330/296
5,392,463 A  *   2/1995  Yamada ....................... 330/284
5,432,473 A  *   7/1995  Mattila et al. ............... 330/279
5,530,923 A  *   6/1996  Heinonen et al. ........... 330/295
6,518,840 B1 *   2/2003  Rahn et al. .................. 330/285

FOREIGN PATENT DOCUMENTS

| EP | 1 191 683 A2 | 3/2002 |
|---|---|---|
| JP | 2001168647 | 8/2002 |
| WO | WO 02/078281 A1 | 10/2002 |

* cited by examiner

*Primary Examiner*—Khanh V. Nguyen

(57) ABSTRACT

The invention provides a system that enables a power amplifier to operate in a compressed mode and then be switched during operations to operate in a linear mode. Broadly conceptualized, the system may include a power amplifier and a bias controller that efficiently permits a communication device to function with either the compressed waveforms of a first air interface system or linear waveforms from other air interface systems.

17 Claims, 4 Drawing Sheets

DUAL MODE POWER AMPLIFIER HAVING A COMMON CONTROLLER

BACKGROUND OF THE INVENTION

1. Technical Field

The invention relates to a bias controller that efficiently permits a communication device to operate in a dual mode.

2. Related Art

Communication through wireless networks has been around for some time. Initial first-generation and second-generation wireless networks were sufficient to provide air interface support for the low-rate data such as voice and text utilized by personal communication devices. However, the explosive growth of the Internet has produced a tremendous increase in the demand for wireless services that simultaneously provide several types of media formats, including streaming video, text with graphics, slides, voice, and music.

For several years, it has been widely known that existing air interfaces are inadequate to satisfy the higher data rate requirements of wireless multimedia services. Recognizing this, the International Telecommunications Union ("ITU") in Geneva, Switzerland proposed requirements to satisfy the higher data rate needs of wireless multimedia services. An example of these requirements includes a proposed specification for third generation wireless services entitled "International Mobile Telecommunications in the year 2000" ("IMT-2000"). The ITU designed the proposed IMT-2000 specification to provide enhanced voice, data, and multimedia services over wireless networks throughout the world.

The Global System for Mobile Communications ("GSM") is the most widely deployed second-generation ("2G") digital mobile phone system. Generally known as the world transmission-technology leader in terms of number of subscribers, the digital GSM mode is the predominant standard in Europe. The European Standard and Technology Institute released the GSM mode standard in 1989. Businesses launched the first commercial services using the GSM mode in 1991. The CDMA ("Code Division Multiple Access") technology is based on the interim international standard 95 ("IS-95") protocol and is a significant 2G standard that is in operation in North America.

Under IMT-2000, a third generation ("3G") digital mobile phone system will include the Enhanced Data Rates for GSM Evolution ("EDGE") mode (also sometimes referred to as a "2.5G system"). The EDGE mode provides significant new air interface improvements over the GSM mode, including higher data transmission rates.

In general, the GSM mode operates as a low-rate, constant-envelope waveform, voice data transmission mode. Accordingly, a compressed amplifier may be utilized when radio frequency ("RF") signals are input into a system operating in the GSM mode. In contrast, the EDGE mode operates as a high-rate, linear waveform, multimedia data transmission mode. Typically, a compressed amplifier may not be employed when RF signals are input into a system operating in the EDGE mode because the compressed amplifier would severally distort that input signal. CDMA, wideband CDMA, and CDMA2000 are similar to the EDGE mode of modulation in that the input signal amplitude may be modified but the signal itself may not be compressed.

The gradual change to 3G wireless networks throughout the world dictates that devices coupled to these networks improve to meet the new requirements while remaining compatible with 2G wireless networks. Accordingly, there is a need for digital communication devices to operate efficiently in a first mode compatible with a 2G system and a second mode compatible with a 3G system. In particular, there is a need for a bias controller for a power amplifier that efficiently permits a mobile phone to operate either in a compressed data transmission mode or in a linear data transmission mode.

SUMMARY

The invention provides a system that enables a power amplifier to operate in a compressed mode and then be switched during operations to operate in a linear mode. Broadly conceptualized, the system may include a power amplifier and a bias controller that efficiently permits a communication device to function with either the compressed waveforms of a first air interface system or linear waveforms from other air interface systems.

The bias controller may include an impedance element, such as for example a resistor, coupled to a voltage buffer and the power amplifier to enable the amplifier to operate in the compressed mode. To operate in the linear mode, the bias controller may include a voltage-to-current converter and a first current mirror coupled to the voltage-to-current converter. The bias controller also may include a reference transistor positioned with the power amplifier to form a second current mirror, and a switch arranged to toggle between the voltage buffer and the first current mirror.

The switch may toggle the voltage buffer from receiving an analog power control voltage in the compressed mode to receiving voltage from the first current mirror in the linear mode. The bias current source (i.e. current mirror) into the reference transistor controls the current in the reference transistor. The voltage established at the collector of the reference transistor forms the control into the voltage buffer.

A process performed by the system may include receiving at the power amplifier an input signal having a constant amplitude. If the switch of the bias controller is in the compressed mode, the voltage buffer may receive an analog power control voltage ($V_{apc}$) and a common collector voltage ($V_{cc}$). The voltage buffer may utilize $V_{apc}$ to modify $V_{cc}$. In turn, the power amplifier may receive the modified $V_{apc}$ along with the compressed waveform input signal. Here, the buffered $V_{apc}$ may affect the operating point of the power amplifier to permit modifying a characteristic of the input signal.

If the switch of the bias controller is in the linear mode, the voltage-to-current converter may provide the current mirror with a current. The voltage buffer may receive a voltage from the first current mirror based on this current and may receive $V_{cc}$. The voltage buffer may utilize the $V_{cc}$ to modify the voltage from the first current mirror. The reference transistor may operate as a feedback to the voltage buffer input to stabilize the voltage from the first current mirror with respect to variations in production process during manufacture and in operating temperature during operation.

The power amplifier may receive the controlled and modified voltage from the first current mirror along with the linear waveform input signal. Here, the controlled and modified voltage from the first current mirror may change the operating point of the power amplifier to permit undistorted amplification of the input signal.

Other systems, methods, features, and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention may be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION OF THE INVENTION

Figure 1:
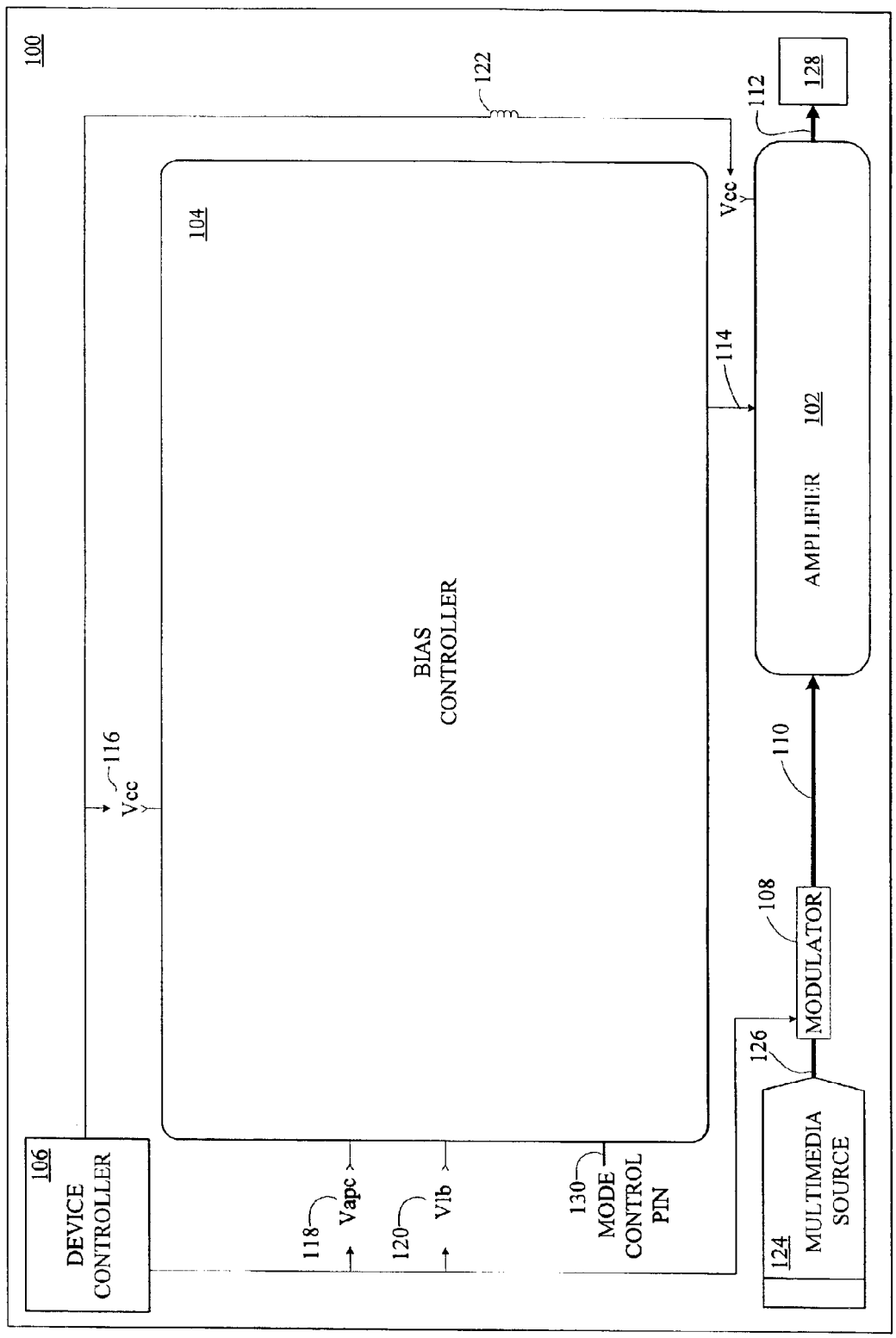
FIG. 1 is a block diagram illustrating an example implementation of a Dual Mode Power Amplifier System in accordance with the invention.

FIG. 1 is a block diagram illustrating an example implementation of a Dual Mode Power Amplifier System ("Dual Mode PAS") 100 in accordance with the invention. The Dual Mode PAS 100 may be located in any communication device configured to pass transmission signals. Examples of these types of communication devices include mobile phones, computers, fixed telephones, radios, and televisions.

In one embodiment, the Dual Mode PAS 100 may include an amplifier 102, a bias controller 104, a device controller 106, and a modulator 108. The amplifier 102 accepts an input signal 110 that may be a time varying signal having characteristics such as for example amplitude, frequency, phase, and pulse. For example, the input signal 110 may be a modulated radio frequency ("RF") signal. The amplifier 102 may produce an output signal 112 that varies in the same way as the input signal 110 but where at least one characteristic is different between the output signal 112 and the input signal 110.

Figure 2:
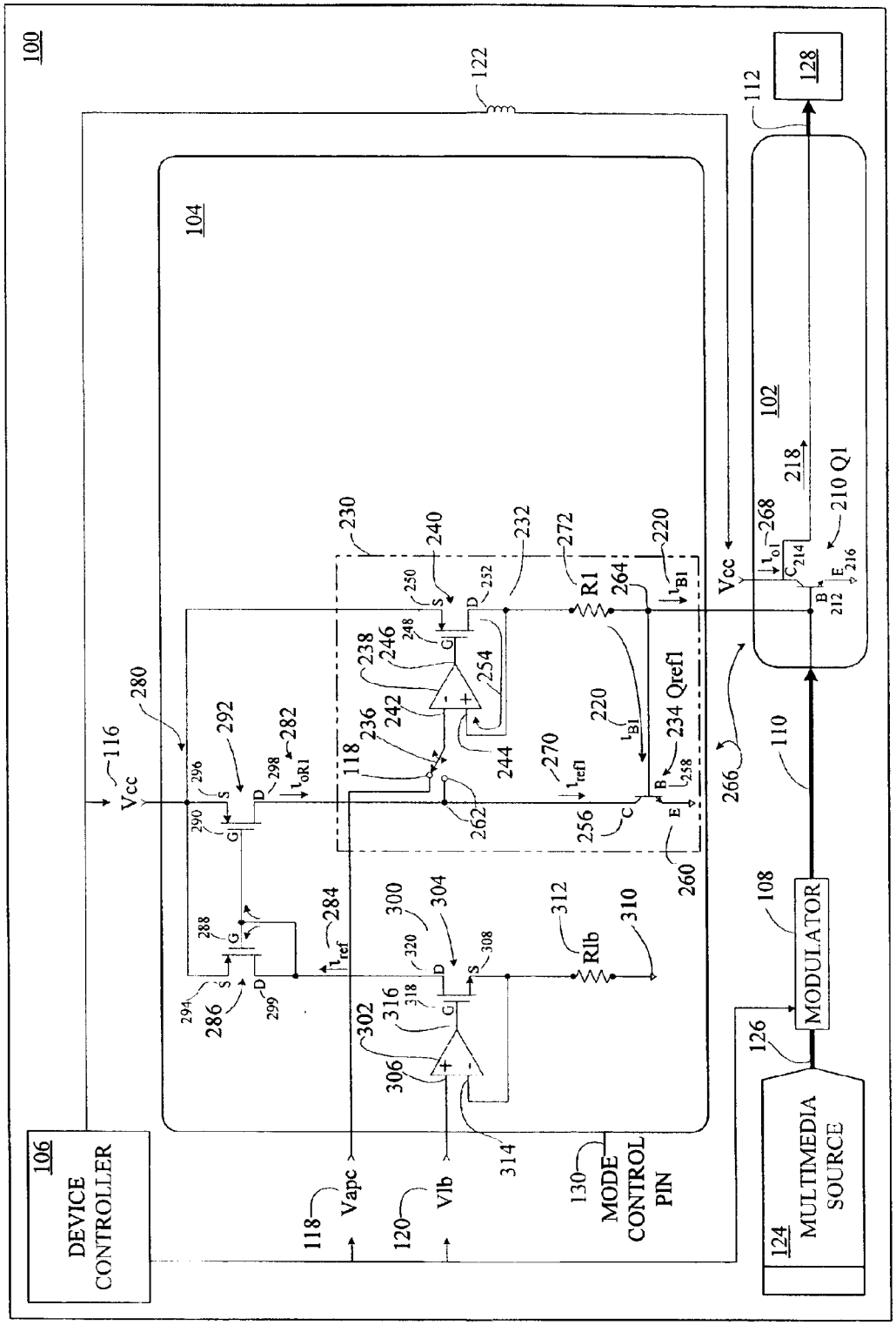
FIG. 2 is a block diagram illustrating an example implementation of the block diagram of FIG. 1.

As an example implementation, the amplifier 102 may include a single stage amplifier built around a single transistor Q (see, e.g., the transistor 210 Q1 of FIG. 2). For many applications, a single transistor does not provide sufficient gain (i.e., amplification) for that application. Thus, the amplifier 102 also may include a plurality of stages that provide the desired gain in the input signal 110. As a multistage amplifier, the amplifier 102 may function to pass along the input signal 110 and amplify the power level of the input signal 110 from one stage to the next to produce the output signal 112.

The bias controller 104 may include circuitry that permits the Dual Mode PAS 100 to operate in either a compressed mode or a linear mode. For example, the bias controller 104 may supply a mode specific signal as a managing bias signal through the bus 114 to the amplifier 102. To generate a mode specific voltage, the bias controller 104 may be coupled to the device controller 106 to receive a common collector voltage ("$V_{cc}$") 116, an analog power control voltage ($V_{apc}$) 118, and a linear bias voltage ("$V_{lb}$") 120. An inductor 122 may be positioned with respect to the device controller 106 and another component, such as for example the amplifier 102, to act as a lowpass filter.

The modulator 108 may be any device configured to vary some characteristic of a signal wave (e.g., the carrier wave) in accordance with an information-bearing signal wave (e.g., the modulating wave). The wave characteristics that may be varied include amplitude, frequency, phase, and pulse. In FIG. 1, the modulator 108 may be coupled to a multimedia source 124 to receive a signal 126 as an unmodulated digital signal.

The multimedia source 124 may originate an information-bearing signal wave as the signal 126. The signal 126 may include any information, such as for example a combination of text, high-quality sound, two- and three-dimensional graphics, animation, photo images, full-motion interactive video, and real time video. Moreover, the signal 126 may be of any kind. Examples of the signal 126 may include RF, sound, and other electromagnetic radiation, including optical waves.

An integrated circuit may be thought of as an electronic circuit built on a substrate, such as for example a single-crystal silicon substrate. As a semiconductor, the substrate may include properties that allow parts of the substrate to vary between being a conductor of electricity and an insulator of electricity. The amplifier 102, the bias controller 104, the device controller 106, and the modulator 108 may be built as part of one or more integrated circuits. These components may function together to amplify the input signal 110 into the output signal 112 and pass that amplified signal downstream to an output 128. The output 128 may be another electrical component, including an amplifier, an antenna of a mobile phone, or a device to process further the output signal 112. To toggle between a compressed waveform data transmission mode and a linear waveform data transmission mode, the Dual Mode PAS 100 may include a mode control pin 130.

FIG. 2 is a block diagram illustrating an example implementation of the block diagram of FIG. 1. In general, the bias controller 104 may apply a small signal to the amplifier 102 to control a larger input signal 110. The amplifier 102 may include a variety of components to aid in this control. For example, the amplifier 102 may include a transistor (Q1) 210. Although shown in FIG. 2 as a bipolar junction transistor ("BJT"), the transistor 210 may be any device configured to modify at least one characteristic of the input signal 110. As an example of such a device, the transistor 210 may be a field effect transistor ("FET") having a source, a gate, and a drain.

When implemented as a BJT, the transistor 210 may include three electrical contacts: a base B 212, a collector C 214, and an emitter E 216. The base 212 may receive the input signal 110 as well as a control signal $\tau_{B1}$ 220 from the bias controller 104. In response to the input signal 110 and the control signal 220, an output signal 218 may appear at the collector 214 as an amplification of the input signal 110. The ratio of the output signal 218 to the input signal 110 results in a voltage gain.

Part of the invention resides in configuring the amplifier 102 to operate either in a compressed data transmission mode or in a linear data transmission mode. However, a basic problem associated with amplifiers is establishing and maintaining the proper values of quiescent current and voltage in the amplifier. As a function of signal values of collector voltage and collector current, the direct current ("dc") operating point may be subject to variations in the temperature surrounding the amplifier under normal operation. Temperature variations may cause unwanted distortion change in an input signal and undesired changes in a predetermined amplification by the amplifier. Moreover, the operating point of one amplifier to the next may vary due to slight changes in the manufacturing process that may occur from batch to batch.

To configure the amplifier 102 to operate in two modes while achieving temperature and process stability, the bias controller 104 may include a switching circuitry 230, a current mirror 280, and a voltage-to-current converter 300. The switching circuitry 230, the current mirror 280, and the voltage-to-current converter 300 may include any arrangement of electrical components. These electrical components may permit the amplifier 102 to operate in a stabilized compressed data transmission mode or in a stabilized linear data transmission mode.

The switching circuitry 230 may include a voltage buffer 232, a reference transistor $Q_{ref1}$ 234, and a switch 236. The voltage buffer (also known as "voltage follower") 232 may produce an output voltage that follows the voltage difference between an inverting (−) input and noninverting (+) input within the range of the power being supplied to the voltage buffer 232. To accomplish this, the voltage buffer 232 may include an buffer amplifier 238 and a buffering transistor 240.

The buffer amplifier 238 may provide extremely high or substantially infinite gain to serve as a gain block. To prevent drawing power from a driving source, the gain block may include extremely high or substantially infinite input impedance. An output impedance of the buffer amplifier 238 substantially may be zero to supply infinite current to a load being driven by the buffer amplifier 238. Moreover, the buffer amplifier 238 substantially may include infinite bandwidth, zero offset voltage, and insensitivity to temperature, power supply variations, and common-mode input signals. The buffer amplifier 238 may be an operational amplifier. In general, the buffer amplifier 238 may be an analog integrated circuit device having two opposite polarity inputs and one output to provide amplified voltage or current. For example, the buffer amplifier 238 may include an inverting input 242, a noninverting input 244, and an output 246.

When implemented as a FET, the buffering transistor 240 may include a gate 248, a source 250, and a drain 252. The gate 248 may be coupled to the output 246 of the buffer amplifier 238. The source 250 may be coupled to $V_{cc}$ 116. The drain 252 of the buffering transistor 240 may be coupled to the noninverting input 244 to provide a negative feedback 254 to the buffer amplifier 238. The feedback is negative because of the inversion of the signal at the buffering transistor 240. Under this arrangement, the voltage buffer 232 may ensure that the voltage at the drain 252 equals the voltage at the inverting input 242, irrespective of any anomalies within the waveform of the voltage from $V_{cc}$ 116.

FIG. 2 shows the buffering transistor 240 as a FET. For a FET, no current (except a minute leakage current) flows through the gate 248. Since little current flows through the gate 248, a FET may be utilized to make circuits with very low power consumption. In the linear mode with the resistor R1 272 remaining in the bias controller 104, the utilization of a FET for the buffering transistor 240 permits operation of the bias controller 104 down to a lower common collector voltage (for example, $V_{cc}$ 116) than would be possible if a BJT were employed or if a noninverting amplifier were employed for the buffer amplifier 238. Thus, a FET is preferred. However, the buffering transistor 240 may be any device configured to aid in ensuring that the voltage at one location on the buffering transistor 240 equals the voltage at the inverting input 242. As an example of such a device, buffering transistor 240 may be a BJT having a collector, a base, and an emitter.

Recall that the switching circuitry 230 may include the voltage buffer 232, the reference transistor $Q_{ref1}$ 234, and the switch 236. The reference transistor 234 may be implemented in a variety of configurations. When implemented as a BJT, the reference transistor 234 may include a collector C 256, a base B 258, and an emitter E 260. The collector 256 may be coupled to a node 262. The base 258 of the reference transistor 234 may be coupled to a node 264 to receive the control signal 220. Moreover, the amplifier 102 may be coupled to the node 264 to receive the control signal 220. In this arrangement, the reference transistor 234 of the switching circuitry 230 and the transistor 210 of the amplifier 102 may form a current mirror 266.

The current mirror 266 of FIG. 2 may function to match an output current $\tau_{o1}$ 268 to a linear mode input current $\tau_{ref1}$ 270. Arranging the reference transistor 234 and the transistor 210 into the current mirror 266 contributes to stabilizing the amplifier 102 with respect to temperature and process variations in the linear mode.

The switch 236 may be any device configured to divert current from one conductor to another. In FIG. 2, the switch 236 may include a first position to couple the inverting input 242 to the $V_{apc}$ 118 and a second position to couple the inverting input 242 to the node 262. The movement of the switch 236 between the first position and the second position may be driven by a signal from the mode control pin 130. The signal from the mode control pin 130 may be from a manual input or an automatic input based on the signal 126, where the signal 126 may be unmodulated.

In the compressed mode during running operations, the voltage at the base 212 of the transistor Q1 210 may be at a fixed value somewhat irrespective of the amount of current received at the base 212 from the node 264. An example of this fixed value is 1.4 volts. However, the amount of the control signal 220 that flows into the base 212 of the transistor 210 may largely influence the amplification of the transistor 210. As $V_{apc}$ 118 increases due to signals from the device controller 106, it is desirable to increase the amount of the control signal 220 that flows into the base 212.

When the switch 236 is at least in the compressed mode, the switching circuitry 230 may include an impedance element. For example, when the switch 236 is coupled to $V_{apc}$ 118, the switching circuitry 230 may include an impedance element, such as a resistor R1 272. The resistor 272 may be coupled between the drain 252 of the voltage buffer 232 and the node 264. In this arrangement, the resistor 272 may linearize the control signal 220 that flows into the base 212 by providing impedance over which the voltage at the drain 252 may develop. Thus, as $V_{apc}$ 118 increases, the voltage at the drain 252 increases. As the voltage at the drain 252 increases, more of the control signal 220 flows through the resistor 272 to the base 212. This functions to increase the amplification of the transistor 210 as a function of a signal from the device controller 106.

As noted above, the amount of the control signal 220 that flows into the base 212 of the transistor 210 may largely influence the amplification of the transistor 210. When the switch 236 is in the linear mode position (the switch 236 to the node 262), the current that flows into the base 212 may be more of a function of the current mirror 266 rather than any voltage developed across the resistor 272.

$V_{cc}$ 116 may be from a potential source, such as for example a battery. Over time, a fully charged 3½ volt battery in a mobile phone will wear down to a point at which the circuitry of the telephone ceases to operate. The talk-time of a user in a mobile phone may be largely a function of the period between the voltage level of a fully charged battery and a voltage level at which the circuit of that telephone ceases to operate.

Figure 3:
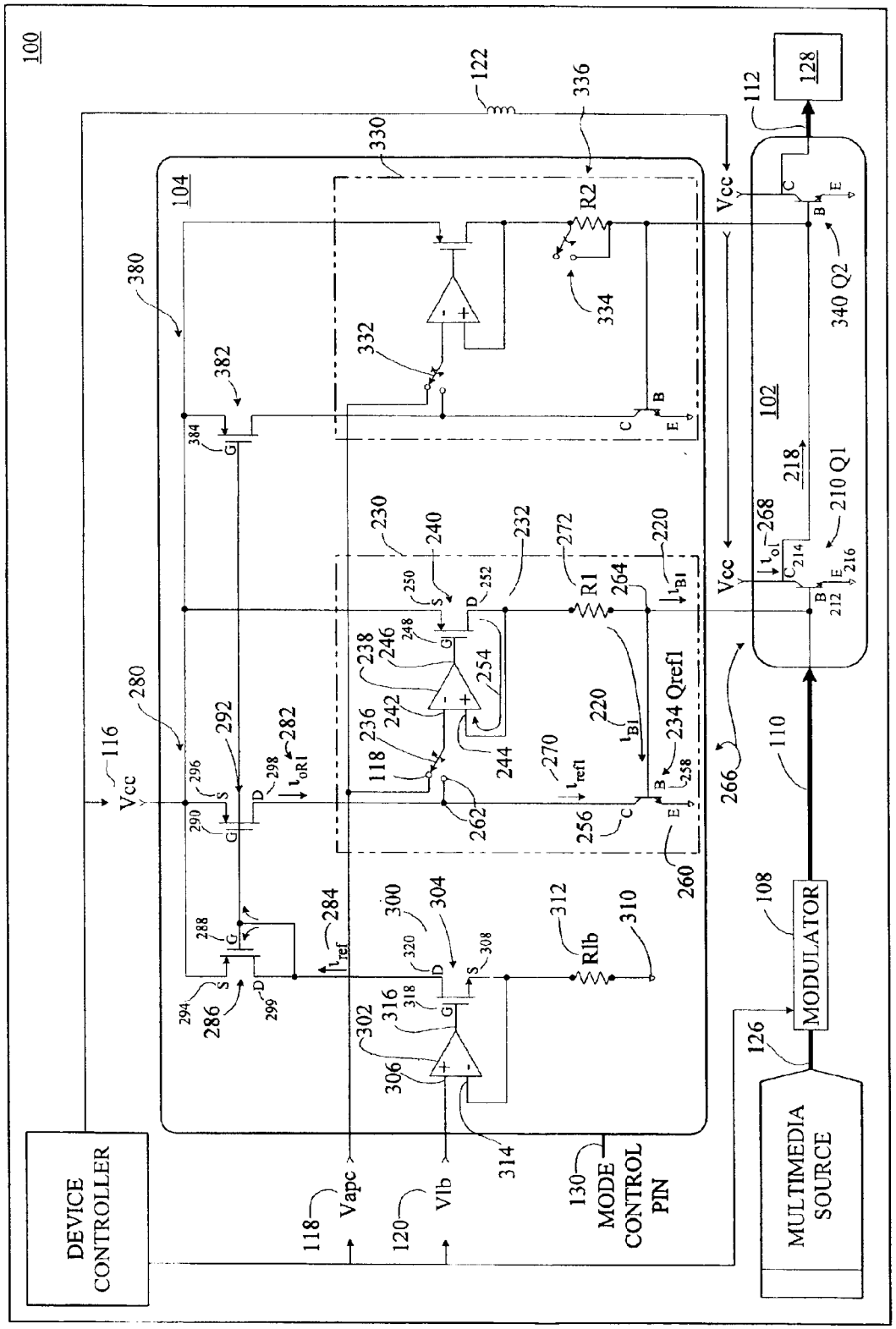
FIG. 3 is a block diagram illustrating a reference transistor added to the amplifier of FIG. 2.

One solution may be to provide a switch to bypass the resistor 272 in the linear mode while permitting the resistor 272 to provide resistance to electrical flow in the compressed mode (see the switch 334 of FIG. 3). While such a switch may provide some benefits, adding such a switch may increase the cost of bias controller 104, may take up valuable integrated circuit space, and may provide another component with which to wear down $V_{cc}$ 116.

Importantly, the components and arrangement of the voltage buffer 232 as shown in FIG. 2 account for the resistor 272 in the linear mode without the additional costs and space use that would be incurred by employing a bypass switch. As noted above, the buffer amplifier 238 may be an operational amplifier where the inverting input (or negative terminal) 242 inverts an input voltage.

As noted above, the current $\tau_{ref1}$ 270 may be a linear mode input current. The current 270 may originate from the current mirror 280 as the output current that is labeled as current $\tau_{oR1}$ 282 in FIG. 2. Similar to the current mirror 266, the current mirror 280 may be any circuit designed to reproduce a reference current 284 to one or more locations as a constant multiple of a reference current 284. In FIG. 2, the current mirror 280 may function to match the current $\tau_{oR1}$ 282 to the reference current 284.

The current mirror 280 may include a transistor 286 and a transistor 292. The transistors 286 and 290 may be implemented through a variety of configurations. When implemented as FETs, the transistor 286 may include a gate 288 that may be coupled to a gate 290 of the transistor 292. Each of the gate 288 and the gate 290 may receive a reference voltage associated with the drain 299 due to the reference current 284. The source 294 of the transistor 286 and the source 296 of the transistor 292 each may be coupled to $V_{cc}$ 116. The drain 298 of the transistor 292 may be coupled to the node 262, whereas the drain 299 may be coupled to the voltage-to-current converter 300.

The voltage-to-current converter 300 may be any circuitry configured to convert the linear voltage 120 to the reference current 284. Included with the voltage-to-current converter 300 may be an amplifier 302 and a transistor 304. A noninverting input 306 of the amplifier 302 may be coupled to receive the linear voltage 120. A source output 308 of the transistor 304 may be coupled to a ground 310 through a linear resistor $R_{lb}$ 312 as well as fed back into an inverting input 314 as a negative feedback. The output 316 of the amplifier 302 may be coupled to a gate 318 of the transistor 304 and a drain 320 may be coupled as an input to the current mirror 280.

FIG. 3 is a block diagram illustrating a reference transistor Q2 340 added to the amplifier 102 of FIG. 2. Here, the amplifier 102 may include the transistor 340 as one of a plurality of transistors. To provide a separate control over the transistor 340, the bias controller 104 may include a switching circuitry 330 and a current mirror 380. The switching circuitry 330 may include a switch 332 to toggle switching circuitry between a compression mode and a linear mode. The switching circuitry 330 may be similar to the switching circuitry 230. The switching circuitry 330 alternatively may include a switch 334 positioned with respect to a resistor R2 336. The current mirror 380 may include a transistor 382. When implemented as a FET, the transistor 382 may include a gate 384 coupled to the gate 288 of transistor 286.

Figure 4:
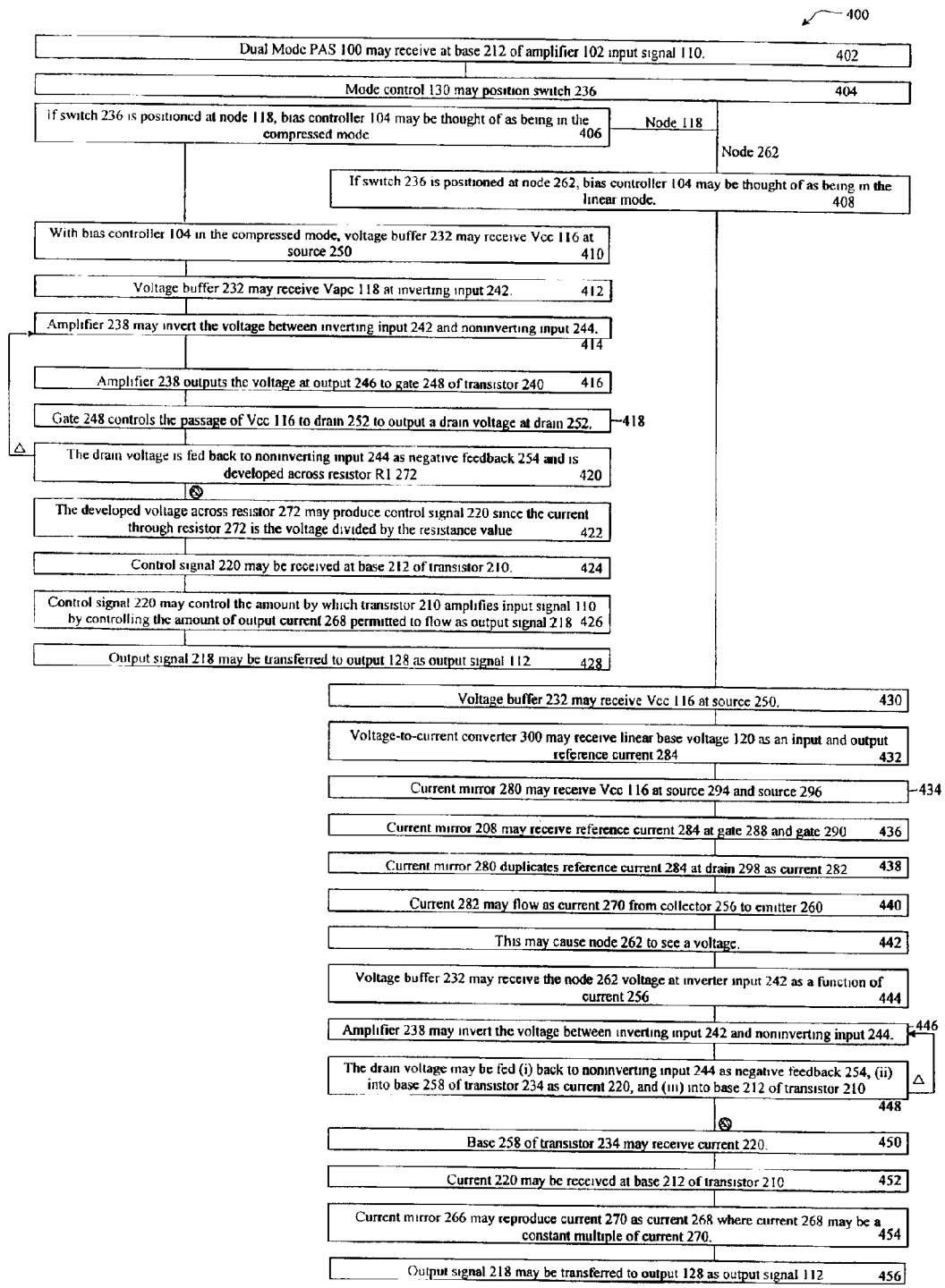
FIG. 4 is a flow chart illustrating an example process performed by the Dual Mode Power Amplifier System of FIG. 2.

FIG. 4 is a flow chart illustrating an example process 400 performed by the Dual Mode PAS 100 of FIG. 2. At 402, the Dual Mode PAS 100 may receive at the base 212 of the amplifier 102 the input signal 110. At 404, the mode control pin 130 may position the switch 236. If the switch 236 is positioned at the node 118 at 406, the bias controller 104 may be thought of as being in the compressed mode. If the switch 236 is positioned at the node 262 at 408, the bias controller 104 may be thought of as being in the linear mode. In the linear mode, process 400 may proceed to 430.

With the bias controller 104 in the compressed mode, the voltage buffer 232 may receive $V_{cc}$ 116 at the source 250 at 410. At 412, the voltage buffer 232 may receive $V_{apc}$ 118 at the inverting input 242. At 414, the buffer amplifier 238 may invert the voltage between the inverting input 242 and the noninverting input 244. If the voltage on the inverting input 242 is more positive than the voltage on the noninverting input 244, the inverted voltage at the output 246 slings more negative. If the voltage on the inverting input 242 is less positive than the voltage on the noninverting input 244, the inverted voltage at the output 246 slings more positive.

At 416, the buffer amplifier 238 outputs the voltage at the output 246 to the gate 248 of the transistor 240. At 418, the gate 248 controls the passage of $V_{cc}$ 116 to the drain 252 to output a drain voltage at the drain 252. If the voltage received at the gate 248 is slung lower, the gate 248 increases the passage of $V_{cc}$ 116 from the source 250 to the drain 252. If the voltage received at the gate 248 is slung higher, then the gate 248 decreases the passage of $V_{cc}$ 116 from the source 250 to the drain 252.

At 420, the drain voltage may be fed back to the noninverting input 244 as negative feedback 254 and may be developed across the resistor R1 272.

If the negative feedback 254 is different from the voltage at the inverting input 242, the voltage buffer 232 is not in equilibrium and the process 400 may return to 414. If the negative feedback 254 is substantially the same as the voltage at the inverting input 242, the voltage buffer 232 may be said to be in equilibrium and the process 400 may proceed to 422.

At 422, the developed voltage across the resistor 272 may produce the control signal 220 since the current through the resistor 272 is the voltage divided by the resistance value. At 424, the control signal 220 may be received at the base 212 of the transistor 210. At 426, the control signal 220 may control the amount by which the transistor 210 amplifies the input signal 110 by controlling the amount of the output current 268 permitted to flow as the output signal 218. At 428, the output signal 218 may be transferred to the output 128 as the output signal 112.

At 430, the voltage buffer 232 may receive $V_{cc}$ 116 at the source 250. At 432, the voltage-to-current converter 300 may receive as input the linear voltage 120. The voltage-to-current converter 300 may produce as output the reference current 284. At 434, the current mirror 280 may receive $V_{cc}$ 116 at the source 294 and the source 296. At 436, the current mirror 280 may receive the reference current 284 at the gate 288 and the gate 290. At 438, the current mirror 280 duplicates the reference current 284 at the drain 298 as the current 282. The current 282 may be a linear multiple of the reference current 284.

At 440, the current 282 may flow as the current 270 from the collector 256 to the emitter 260. This may cause the node 262 to see a voltage at 442. At 444, the voltage buffer 232 may receive the node 262 voltage at the inverting input 242 as a function of current 270.

At 446, the buffer amplifier 238 may invert the voltage between the inverting input 242 and the noninverting input 244. If the voltage on the inverting input 242 is higher than the voltage on the noninverting input 244, the inverted voltage at the output 246 slings lower. If the voltage on the inverting input 242 is lower than the voltage on the noninverting input 244, the inverted voltage at the output 246 slings higher.

At 448, the drain voltage may be fed back to the noninverting input 244 as the negative feedback 254. The drain voltage also may be fed into the base 258 of the transistor 234 as the control signal 220. Additionally, the drain voltage may be fed into the base 212 of the transistor 210.

If the negative feedback 254 is different from the voltage at the inverting input 242, the voltage buffer 232 is not in equilibrium and the process 400 may return to 446. If the negative feedback 254 is substantially the same as the voltage at the inverting input 242, the voltage buffer 232 may be said to be in equilibrium and the process 400 may proceed to 450.

At 450, the base 258 of the transistor 234 may receive the control signal 220. If the control signal 220 increases at the base 258, more current may be permitted to flow from the collector 256 to the emitter 260. The current mirror 280 may respond by decreasing the voltage at the node 262 and thus stabilize the loop. If the control signal 220 decreases at the base 258, less current may be permitted to flow from the collector 256 to the emitter 260. The current mirror 280 may respond by increasing voltage at the node 262 to stabilize the loop.

The current mirror 280 may be driven by the device controller 106 through the voltage-to-current controller 300 to produce a current 282. The current 282 may be predetermined by the device controller 106. The closed loop of the node 262, the buffering transistor 240, and the reference transistor 234 automatically adjusts the control signal 220 into the base 258 despite temperature or process variations. The effect is to insure that the current at the node 262 is the current that is predetermined by the device controller 106.

At 452, the control signal 220 may be received at the base 212 of the transistor 210. At 454, the current mirror 266 may reproduce the current 270 as the current 268 where the current 268 may be a constant multiple of the current 270. By reproducing the current 270 as the current 268, the current mirror 266 functions to control the amount of the current 268 permitted to flow as the output signal 218. In turn, this may control the amount by which the transistor 210 amplifies the input signal 110. At 456, the output signal 218 may be transferred to the output 128 as the output signal 112.

The exemplary embodiments described herein are provided merely to illustrate the principles of the invention and should not be construed as limiting the scope of the subject matter of the terms of the claimed invention. The specification and figures are, accordingly, to be regarded in an illustrative rather than a restrictive sense. Moreover, the principles of the invention may be applied to achieve the advantages described herein and to achieve other advantages or to satisfy other objectives, as well.

What is claimed is:

1. A dual mode power amplifier system, comprising:
   an amplifier; and
   a bias controller coupled in signal communication to the amplifier and configured to permit the amplifier to operate in a compressed data transmission mode and in a linear data transmission mode;
   where an amplifier transistor of the amplifier forms a current mirror with a reference transistor of the bias controller.

2. The dual mode power amplifier system of claim 1, where the bias controller includes a voltage buffer configured to sense one of a voltage of the reference transistor or a control voltage.

3. The dual mode power amplifier system of claim 2, where the amplifier is a first amplifier and the voltage buffer includes a buffer amplifier coupled in signal communication to a buffering transistor.

4. The dual mode power amplifier system of claim 3, the bias controller further comprising an impedance element positioned relative to the buffering transistor and the transistor of the first amplifier.

5. The dual mode power amplifier system of claim 4, the bias controller comprising a bypass switch positioned relative to the impedance element.

6. The dual mode power amplifier system of claim 3 where the buffering transistor is a Field Effect Transistor.

7. The dual mode power amplifier system of claim 1, where a first amplifier transistor of the amplifier forms a first current mirror with a first reference transistor of the bias controller and where a second amplifier transistor of the amplifier forms a second current mirror with a second reference transistor of the bias controller.

8. A dual mode power amplifier system comprising:
   an amplifier configured to amplify an input signal to produce an output signal; and
   a bias controller coupled in signal communication to the amplifier, the bias controller having a means for biasing the amplifier to operate in a compressed data transmission mode and in a linear data transmission mode;
   where an amplifier transistor of the amplifier forms a current mirror with a reference transistor of the means for biasing.

9. The dual mode power amplifier system of claim 8, where the means for biasing includes a voltage buffer configured to sense one of a voltage of the reference transistor or a control voltage.

10. The dual mode power amplifier system of claim 9, where the amplifier is a first amplifier and the voltage buffer includes a buffer amplifier coupled in signal communication to a buffering transistor.

11. The dual mode power amplifier system of claim 10, the means for biasing further comprising an impedance element positioned relative to the buffering transistor and the transistor of the first amplifier.

12. The dual mode power amplifier system of claim 11, the means for biasing further comprising a bypass switch positioned relative to the impedance element.

13. A process, comprising:
   present a bias controller coupled in signal communication to an amplifier;
   receiving a first input signal at the amplifier;
   moving a switch in a bias controller from a first position to a second position, where the first position represents one of a compressed data transmission mode and a linear data transmission mode and the second position represents the other of the compressed data transmission mode and the linear data transmission mode;
   receiving a second input signal at the amplifier from the bias controller;
   communicating the first input signal through the amplifier as a function of the second input signal;

where the first switch is coupled to a first voltage buffer and, in the first position, the switch is coupled to an analog power control voltage source and in the second position, the switch is coupled between a first reference current mirror and a first reference transistor, the process further comprising:

outputting a first current from a voltage-to-current converter coupled to a first reference current mirror;

producing a second current as a constant multiple of the first current by employing the reference current mirror;

distributing the second current to a first reference transistor, where the first reference transistor is coupled to the first amplifier transistor to form a first control current mirror, where a first voltage buffer is coupled between the first reference transistor and the first amplifier transistor; and amplifying a characteristic of the first input signal by producing a third current in the first amplifier transistor as a constant multiple of the second current by employing the first control mirror.

14. The process of claim 13, further comprising: receiving a second input signal at the base of the first transistor of the amplifier; moving the first switch from the second position to the first position; receiving a first voltage at the first voltage buffer; and outputting a second voltage from the first voltage buffer as a function of the first voltage.

15. The process of claim 14, further comprising generating a control current by developing the second voltage over a resistor coupled between the first voltage buffer and the base of the amplifier transistor; and amplifying a characteristic of the second signal by passing the control current into the base of the amplifier transistor.

16. A dual mode power amplifier system, comprising:

an amplifier; and a bias controller coupled in signal communication to the amplifier and configured to permit the amplifier to operate in a compressed data transmission mode and in a linear data transmission mode;

wherein an amplifier transistor of the amplifier forms a current mirror with a reference transistor of the bias controller, and;

wherein the bias controller and the amplifier are located on the same integrated circuit.

17. A dual mode power amplifier system, comprising:

an amplifier configured to amplify an input signal to produce an output signal; and a bias controller coupled in signal communication to the amplifier, the bias controller having a means for biasing the amplifier to operate in a compressed data transmission mode and in a linear data transmission mode;

wherein an amplifier transistor of the amplifier forms a current mirror with a reference transistor of the means for biasing; and wherein the bias controller and the amplifier are located on the same integrated circuit.

* * * * *